United States Patent [19]

Feinstein, Jr. et al.

[11] Patent Number: 5,296,828
[45] Date of Patent: Mar. 22, 1994

[54] COIL FOR MAGNETIC REPULSION PUNCH

[75] Inventors: Paul Feinstein, Jr., Austin; Robert N. Price, Round Rock; Verlon E. Whitehead, Austin; John A. Williamson, Round Rock, all of Tex.

[73] Assignee: International Business Machines Corporation, Armonk, N.Y.

[21] Appl. No.: 743,002

[22] Filed: Aug. 9, 1991

[51] Int. Cl.[5] .............................................. H01F 5/00
[52] U.S. Cl. ..................................... 335/300; 336/60; 83/171
[58] Field of Search ............... 335/300, 299, 282, 216; 336/55, 57, 58, 59, 60, 61, 62, 206, 223; 310/52-65; 83/169-171, 575-577

[56] References Cited

U.S. PATENT DOCUMENTS

| | | | |
|---|---|---|---|
| 3,056,071 | 9/1962 | Baker et al. | 335/300 |
| 3,195,085 | 7/1965 | Moore | 336/60 |
| 3,730,039 | 5/1973 | Fedrigo | 83/170 |
| 4,209,129 | 6/1980 | Haas et al. | 234/108 |
| 4,425,829 | 1/1984 | Kranik et al. | 83/62.1 |
| 4,821,614 | 4/1989 | Fleet et al. | 83/100 |
| 4,872,381 | 10/1989 | Stroms | 83/76.1 |

OTHER PUBLICATIONS

IBM TDB "Flexpunch Machine", vol. 31, No. 9, Feb. 1989, pp. 140-141.
IBM TDB "Via Punching Device for Multi-Layered Ceramic Substrates", vol. 32, No. 7, Dec. 1989, pp. 255-257.
IBM TDB "Coil Design for Magnetic Repulsion Punch", vol. 33, No. 4, Sep. 1990, pp. 219-220.
IBM TDB, "Automated Punch Apparatus for Forming Via Holes in Ceramic Greensheet", vol. 20, No. 4, Sep. 1977, pp. 1379-1380.
IBM TDB "Automated Punch Apparatus Support Mechanism", vol. 26, No. 7B, Dec. 1983, pp. 3570-3572.
IBM TDB "Magneto Repulsion Punch Drive Circuit", vol. 31, No. 7, Dec. 1988, pp. 423-424.
IBM TDB "Adapter Punch System (HDC Packaging)" vol. 33, No. 4, Sep. 1990, pp. 221-222.

Primary Examiner—Leo P. Picard
Assistant Examiner—Raymond Barrera
Attorney, Agent, or Firm—Mark E. McBurney

[57] ABSTRACT

A tape wound coil is provided, for use in magnetic repulsion punching, that has a plurality of slits therein which allow circulation of coolant therethrough. This coil is made of thin copper foil, or the like that is treated with an epoxy, for electrical insulation between the windings, and then wound around a center post. The face of the coil is machined smooth, whereas a counter bore is machined into the back of the coil such that a portion of the center post and the inner most windings are removed. Radial slits are then machined into the back of the coil, which will allow for the coolant flow. Thus, a coil for use in magnetic repulsion punching is provided which maximizes the capacity for carrying electrical current and increases the winding density exhibited by conventional M-R coils. Further, the coil of the present invention will withstand high repetition mechanical shear forces created as a result of the large amount of electrical current pulsing through the windings.

8 Claims, 5 Drawing Sheets

COIL FOR MAGNETIC REPULSION PUNCH

BACKGROUND OF THE INVENTION

1. Field of the Invention

The present invention relates generally to punching plural holes in a substrate, such as "greensheet", or a metal foil at a high rate of speed. More particularly, an electrical coil is described that has enhanced cooling features, which increases the speed and reliability of the magnetic repulsion punch apparatus, in which the coil is used.

2. Description of the Related Art

Magnetic repulsion technology has been utilized for several years to punch greensheets in order to form multilayer ceramic substrates for use in the computer industry. Briefly, the repulsive forces generated between an energized electrical coil and an electrically conductive punch head, or disk, is used to drive the punch into a dielectric material, thereby forming holes. These holes or vias are then aligned on adjacently stacked dielectric sheets and metallized to form multilayer substrates. More specifically, several configurations of coils have been utilized in magnetic repulsion punches with varying degrees of success.

For example. U.S. Pat. No. 4,821,614, hereby incorporated by reference, describes a wire wound coil that includes plural configurations of spacers, adjacent to the wire, which allow cooling fluid to be circulated radially through the coil. However, it has been found that the mechanical characteristics of wire wound coils will not meet the requirements of a production type magnetic repulsion (M-R) tool, thereby causing extensive down time. It has been determined that this type of coil has an average life of approximately 15 million cycles. Further it can be seen that by creating spaces between the wound wires, less conductive material can be included in the coil such that electrical performance is degraded.

U.S. Pat. No. 4,872,381, hereby incorporated by reference, uses a coil that is photoetched from a flat copper or aluminum sheet. This coil is made from two separate etched pieces and then assembled. Liquid coolant is circulated through the coil. A problem exists with this design, because there is not a sufficient number of turns to provide the necessary magnetic force, nor is the crossectional area of the conductors sufficient to make the impedance acceptably low.

To solve the problems exhibited by the coils in the previous magnetic repulsion tools, a tape wound coil was developed and is described in IBM Technical Disclosure Bulletin, Vol. 33, No. 4, September 1990, pps. 219-220, hereby incorporated by reference. This coil was cooled by exposing one of the generally planar sides of the coil to a coolant. Although providing adequate electrical characteristics, the tape coil was not able to operate at the necessary high frequency due to lack of a sufficient cooling mechanism.

Additionally U.S. Pat. No. 4,209,129 describes a cooling system for the punch head of a solenoid operated punch apparatus. More particularly, coolant is circulated through a manifold chamber to conduct heat away from a punch assembly.

It would be desirable to have a coil for use in a magnetic repulsion punch apparatus that exhibited all of the electrical characteristics of a tape wound coil, but without the cooling problems associated with these types of coils. Further a method of consistently making coils that exhibit these electrical and cooling characteristics would be advantageous.

SUMMARY OF THE INVENTION

In contrast to the prior art, the present invention is a tape wound coil having a plurality of slits therein which allows circulation of coolant therethrough. Broadly, a coil made of thin copper foil, or the like, is treated with an epoxy, for providing electrical insulation between the windings, and wound around a center post. A planar face of the coil is machined smooth, whereas a counter bore is machined into the back of the coil such that a portion of the center post and the inner most windings are removed. Radial slits are then machined into the back of the coil, which will allow for the coolant flow.

Thus, a coil for use in magnetic repulsion punching is provided which maximizes the capacity for carrying electrical current and increases the winding density currently exhibited by conventional M-R coils. Further, the coil of the present invention will withstand high repetition mechanical shear forces created as a result of the large amount of electrical current pulsing through the windings.

Therefore, in accordance with the previous summary, objects features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
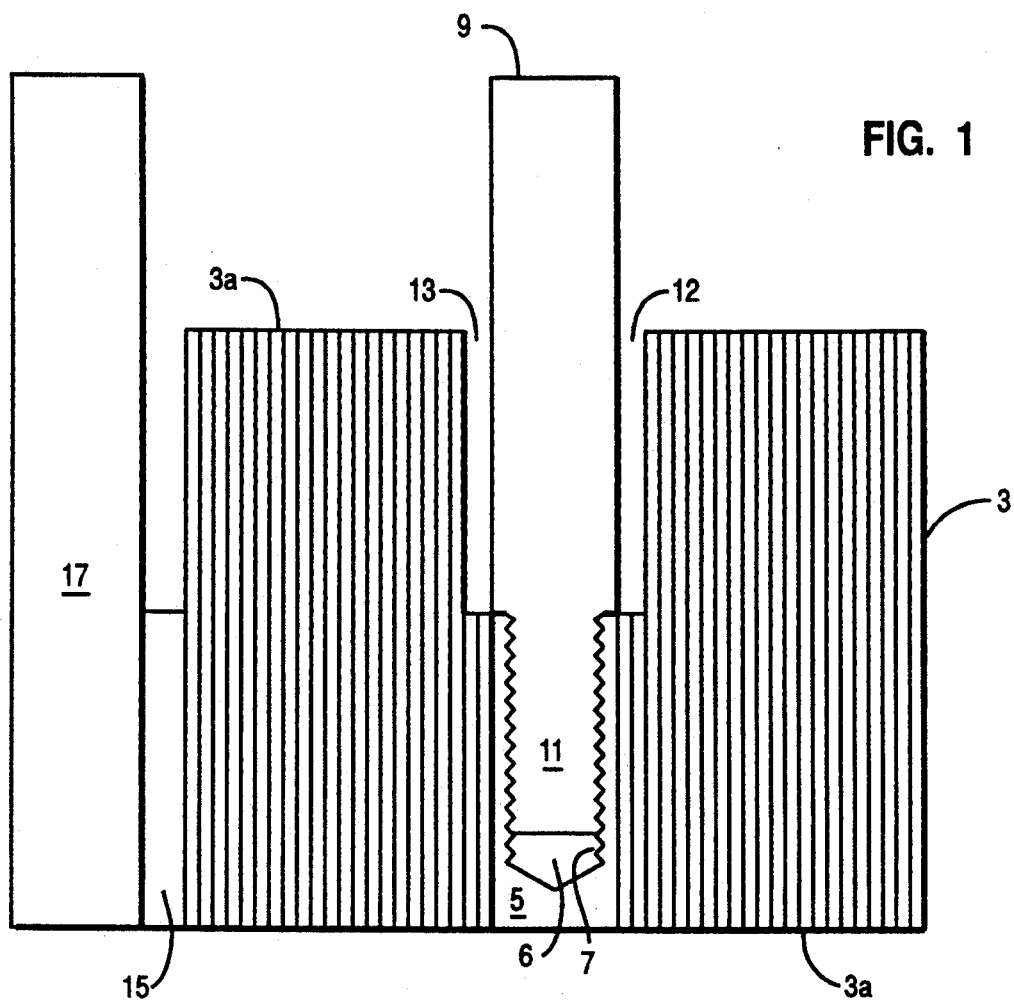
FIG. 1 is a crossectional view of the tape wound coil of the present invention prior to the formation of cooling slits therein.
Figure 5:
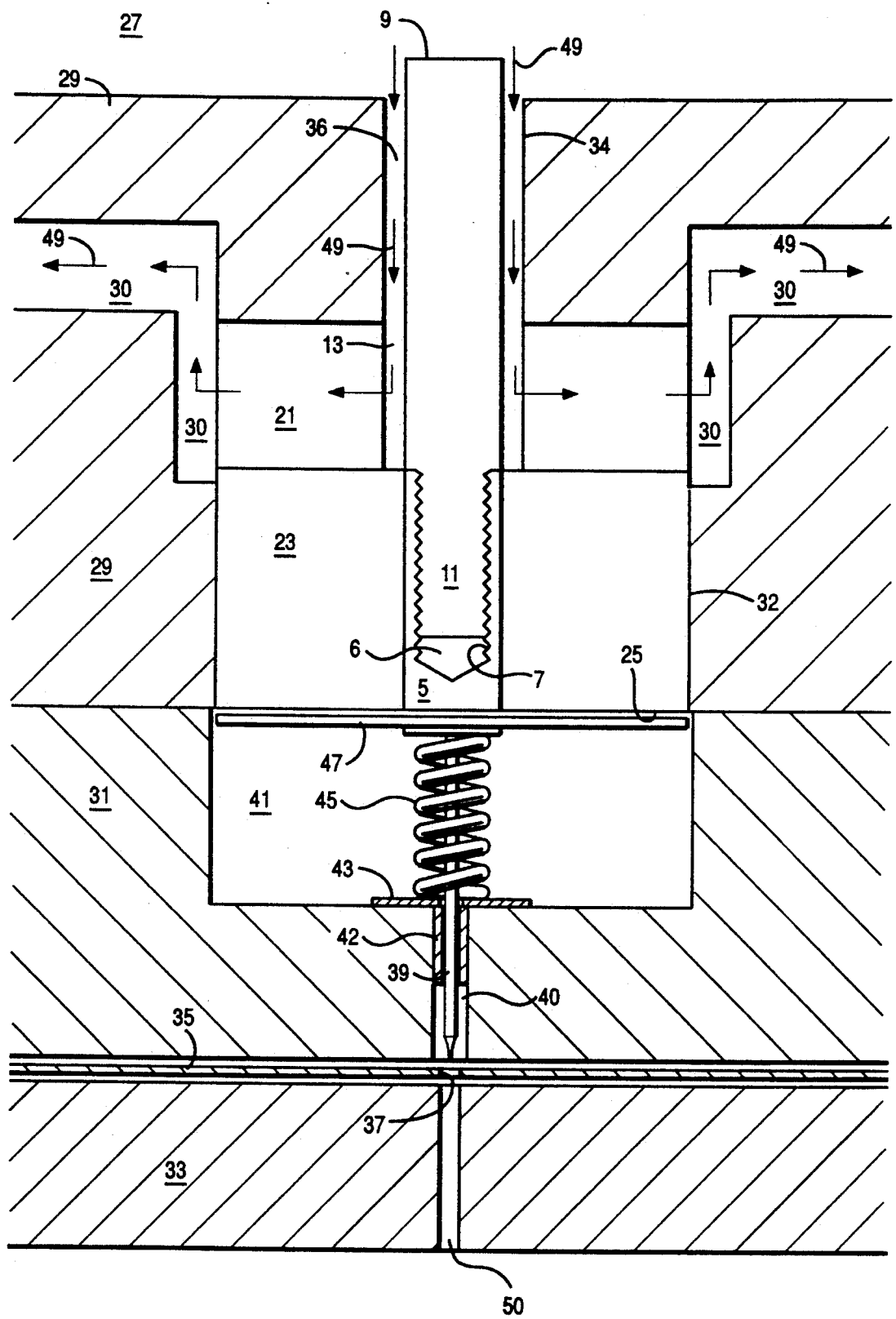
FIG. 5 is a crossection of a portion of a magnetic repulsion punch with the coil of the present invention disposed therein.

Referring to FIG. 1 a tape wound coil is shown and generally referred to by reference numeral 1. Conductive foil windings 3 are shown concentrically layered (wound) about a center post 5 (see FIG. 6). Individual metal foil layers 3a may consist of any electrically conductive material but copper foil was used in the preferred embodiment of the present invention and exhibits desirable electrical and mechanical characteristics. Center post 5 includes a cylindrical cavity portion 6 having threaded walls 7. A center terminal post 9 with a threaded end portion 11 can be threadedly engaged with threads 7 of center post 5. A cavity 12 is included within winding 3 such that annular area 13 is formed about the circumference of center terminal 9, when terminal 9 is engaged with center post 5, and will aide in the dissipation of heat generated by coil 3, as described in detail below. A layer 15 of the copper foil 3a utilized by windings 3 is shown unwound from coil 1 and attached to an outer terminal post 17. It will be understood by those skilled in the art that outer terminal post 17 and center terminal post 9 will be connected to a cyclically operated power supply which energizes windings 3 of coil 1 and induces magnetic energy, which is used to drive a punch through a substrate material to form holes therein (FIG. 5).

Figure 2:
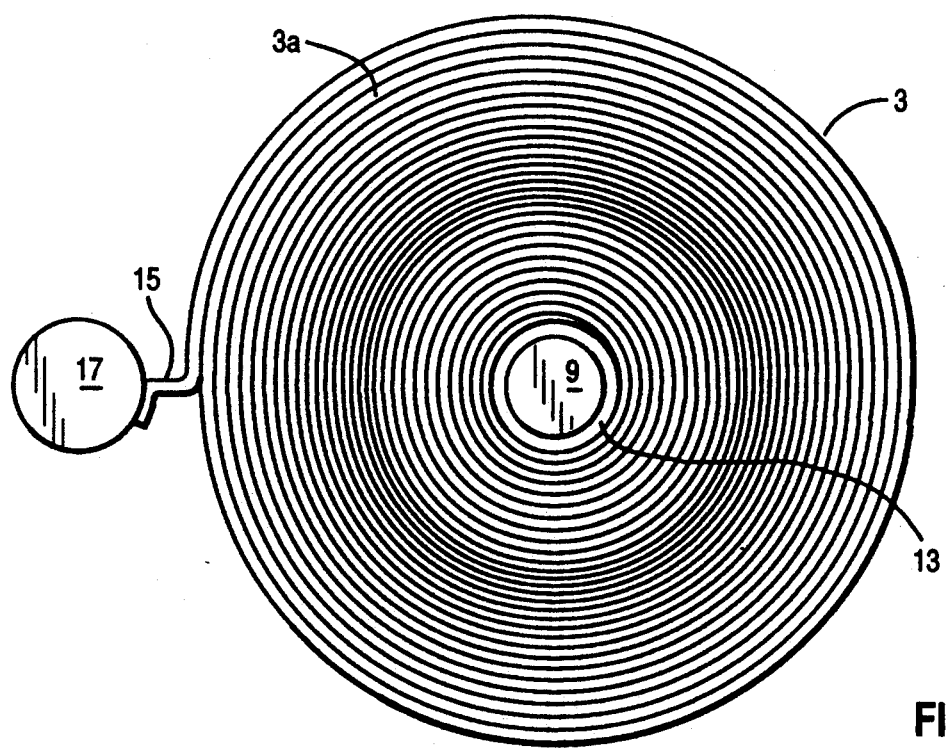
FIG. 2 is a plan view of the coil of FIG. 1.

FIG. 2 is plan view of coil 1 of FIG. 1 and shows concentric windings 3. Further, center terminal post 9 and the annular area 13, as well as outer terminal post 17 and the attached single foil layer 15 are illustrated in FIG. 2. It can be seen that the metal foil 15 can be affixed to outer terminal post 17 by conventional means such as soldering or the like.

Figure 3:
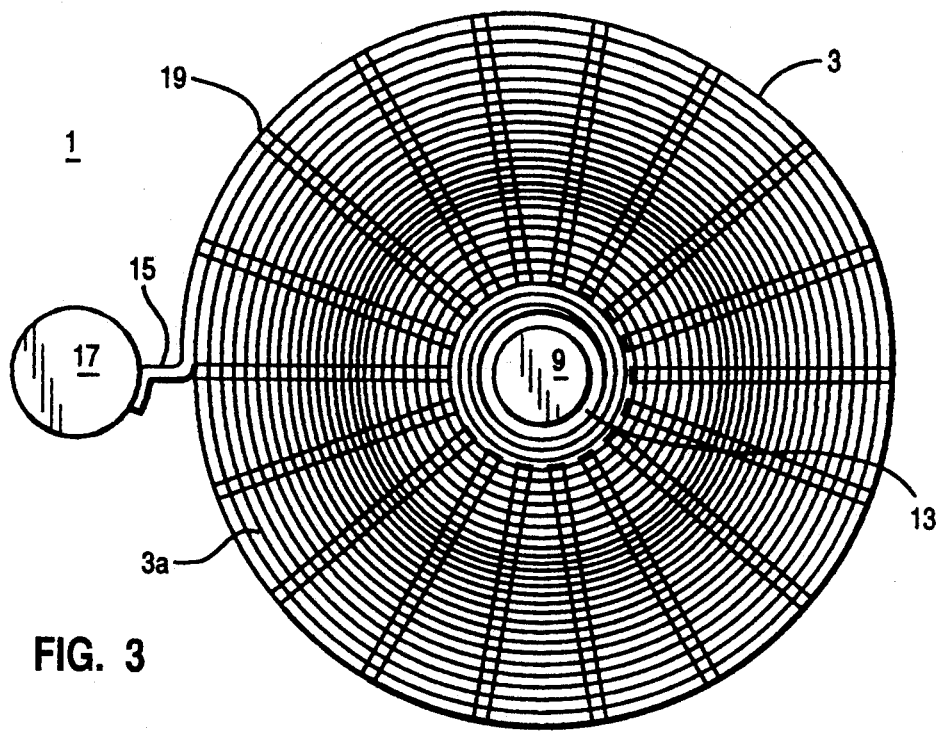
FIG. 3 is a plan view of the tape wound coil with cooling slits therein.

FIG. 3 is a plan view of coil 1, similar to previously described FIG. 2. However, FIG. 3 shows cooling slits 19 which are radially disposed coolant passageways, formed into the winding 3 of coil 1. Again, terminal post 9 and 17 are shown, as well as connecting foil layer 15. Additionally, annular area 13 is shown surrounding center terminal post 9 and in communication with slits 19, which extend radially outward from annular area 13 to the circumference of the coil 1. Thus, each layer 3a of winding 3 is intersected by plural cooling slits 19.

Figure 4:
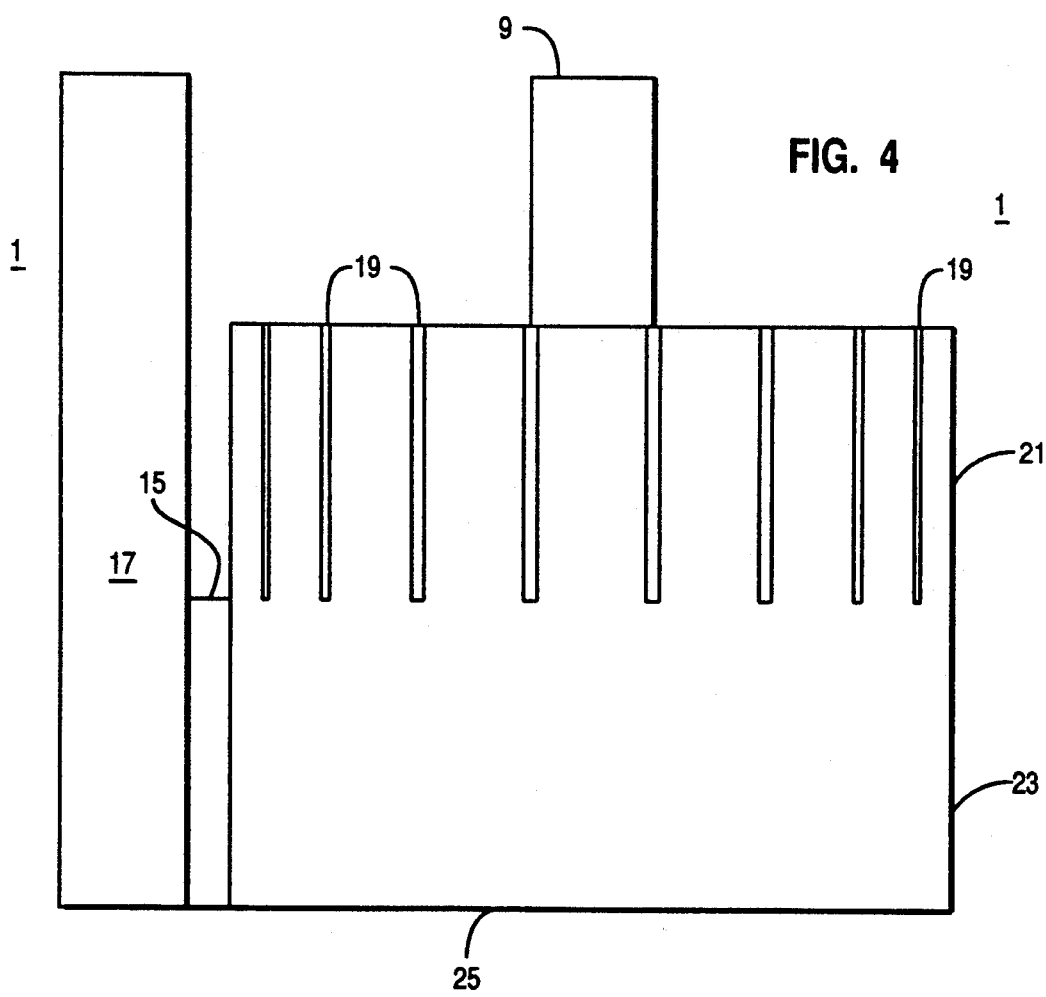
FIG. 4 is an elevation view of the coil of FIG. 3.

FIG. 4 is an elevation view of coil 1 showing a lower portion 23 and a plurality of slits 19 formed in a top portion 21. It can be seen that slits 19 cannot be extended across the entire width of coil 1 without degrading mechanical and electrical performance. In the preferred embodiment, coil 1 requires a thickness of approximately $\frac{5}{8}$ inches in order to fit into the magnetic punch apparatus. It has been found that a slit 19 with a thickness approximately $\frac{1}{2}$ the coil thickness, or in this case 5/16 inches will provide good results. Thus, the thickness of upper portions 21 and lower portion 23 are each approximately 5/16 inches. A planar surface 25 of coil 1, on a side opposite the slits, will be used to interface with a punch head, as described below.

Next, the operation of the tape wound coil of the present invention in a magnetic repulsion punch will be described in conjunction with FIG. 5. FIG. 5 shows a magnetic repulsion punching apparatus which is generally referred to by reference numeral 27. An upper housing 29 is shown which includes cooling channels 30 disposed therein. Housing 29 also includes a first cavity portion defined by a generally cylindrically shaped wall 32 which receives coil 1. Further, a second cavity, defined by wall 34 is included in housing 29. The diameter of the second cavity, defined by wall 34, is equal to the diameter of the annular area 13 of FIG. 1. Thus, as coil 1 is placed into housing 29, a second annular area 36 is defined between center terminal 9 and wall 34 which is in communication with annular area 13.

A punch assembly is shown which includes a punch head 47 that is generally configured as a copper disk, although other suitable electrically conductive materials such as aluminum or the like are contemplated by the present invention. A shaft 39 extends downward from punch head 47. Biasing means 45, such as spring, or the like, biases punch head 47 adjacent surface 25 of lower portion 23 of coil 1. Retaining means 43, such as a washer, or the like, provides a surface that maintains spring 45 in compression between punch head 47 and a lower housing 31 of the magnetic repulsion punch apparatus 27.

Lower housing 31 includes a cavity 41 which allows punch head 47 to move upwardly and downwardly therein. A second cavity 40 is in communication with cavity 41 and allows shaft 39 to extend downwardly from lower housing 31. Guide bushing 42 is provided within cavity 41 and ensures proper vertical alignment of shaft 39 therein. A substrate support 33 is also shown and includes a cavity 50 capable of receiving shaft 39 as it is driven downwardly from lower housing 31. It can be seen that lower portion 33 will support substrate material 35, which is disposed adjacent to lower housing 31, during punch operations. Further, a hole 37 is shown which has been formed in substrate material 35 by punch shaft 39, as it was driven downwardly in response to the energization of coil 1.

In operation, center terminal 9 and outer terminal 17 (not shown) are energized, thereby providing electrical energy to winding 3 of coil 1 which in turn induces magnetic energy due to the winding turns. This magnetic energy is then transferred, as a repulsive force, to disk 47 of the punch assembly, thereby driving shaft 39 downwardly to punch hole 37 in substrate material 35. Additionally, it can be seen that coolant will be circulated through coil 1 in order to dissipate heat which is generated due to the operation of the coil. A liquid coolant, such as water, or the like is introduced into annular areas 36 and 13 in a direction as shown by arrows 49. This coolant is introduced under pressure and forced from annular area 13 through upper portion 21 of coil 1 by way of slits 19 formed therein. In this manner, each individual concentric winding layer 3a is contacted by the liquid coolant flowing therethrough which results in enhanced cooling of the tape wound coil 1. Upon exiting portion 21 of winding 3, coolant flows into channel 30 of upper housing 29 (again as shown by arrows 49) and exits punch apparatus 27, thereby dissipating heat from the coil 1.

It has been found through testing that the original tape wound coil, absent any cooling, was able to operate at punch rates of only 10 cycles per second. However, upon utilization of the cooling slits 19 of the present invention the maximum punch rate was increased from 10 cycles per second to 240 cycles per second. Additionally, a reliability test was conducted on the coil of the present invention at a 100 cycle per second rate. It has been shown through testing that the wire wound coil described by U.S. Pat. No. 4,821,614 was capable of operating for an average life of approximately 15 million cycles. However, coil 1 of the present invention was operated through 350 million cycles with no visible degradation of the coil.

The process utilized to fabricate the tape wound magnetic repulsion coil 1 with cooling of the present invention will now be described with reference to FIGS. 6-10. Several criteria must be met in order to form a coil having suitable characteristics to be used in a magnetic repulsion punch application. First, a conductor is desired that will maximize the capacity for carrying electrical current, i.e. a greater crossectional area of the windings, and include surface treatments between the windings that minimize wasted space thereby increasing winding density. Next, sufficient dielectric insulation must be provided on the conductor surface to prevent electrical shorts from occurring between the winding layers, while at the same time making the insulation thin enough to ensure a maximum number of winding turns. The dielectric must also form a bonding surface so that the entire coil can be laminated. Finally, the coil unit must have high structural integrity in order to withstand the machining operations, that form the slits 19, resist high repetition mechanical sheer forces created as result of electrical current pulsing through the winding 3, and eliminate any possibility of voids between the windings in order to prevent leakage therethrough.

Figure 6:
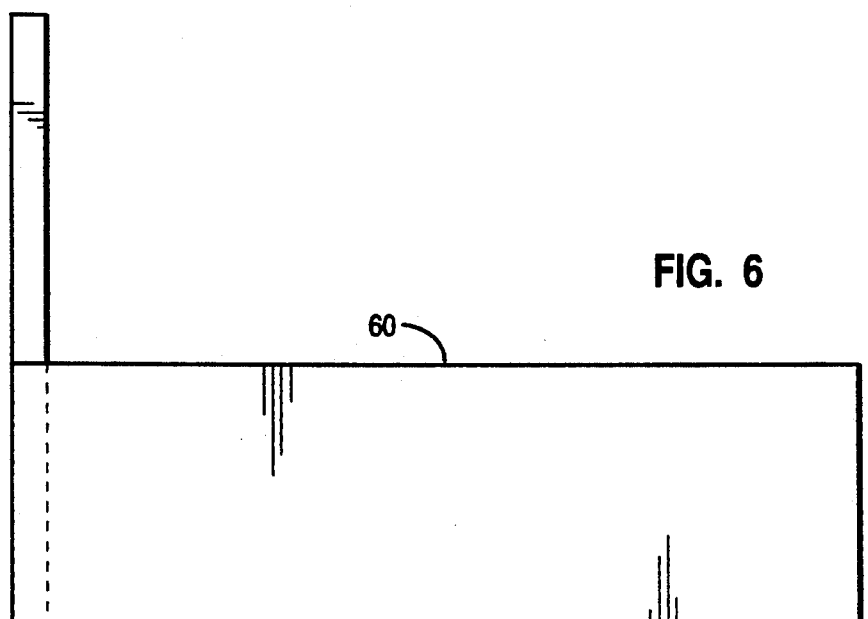
FIG. 6 shows the metal foil used to make the tape coil.

Referring to FIG. 6, center post 5 is shown prior to any machining that subsequently occurs to yield the configuration shown in FIG. 1. A strip of metal foil 60 is shown attached to center post 5. Copper foil which is used for metal foil 60 in the preferred embodiment has been previously treated with an electrodeposit process on both surfaces thereof. The electrodeposit provides a mechanical bonding (roughened) surface for a dielectric material, such as epoxy, which is applied by roll coating, curtain coating, or the like in a thin layer on the metal foil. This dielectric coating must be applied in a thin enough layer to assure high lamination density, but thick enough to provide adequate dielectric strength. The dielectric epoxy must then be cured to ensure good adhesion in the subsequent lamination phase. After the curing of the dielectric, the foil can be cut into strips of the desired processing width as shown by strip 60 of FIG. 6. As previously discussed, the preferred embodiment utilizes coil of approximately ⅝ inches, but for processing purposes the width of strip 60 is chosen to be 1.25, inches because two coils can be formed from a single strip 60.

Figure 7:
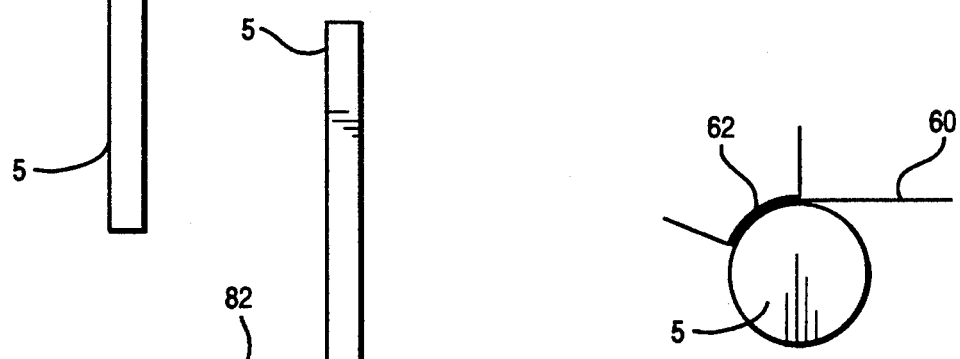
FIG. 7 illustrates how the metal foil is affixed to the center post.

Next, the foil strip 60 is attached to center post 5 by means such as soldering, welding or the like. It has been determined that a 50/50 percent tin/lead solder provides good results. FIG. 7 shows a side view of center post 5 and metal foil 60 and solder area 62, wherein the actual soldering of strip 60 to post 5 occurs. It should be noted that the joining metallurgy between strip 60 and post 5 should be very thin in order to ensure the maximum number of winding turns for a given coil diameter, i.e. any excess solder, or other chemicals must be removed after attachment of strip 60 to post 5.

Figure 8:
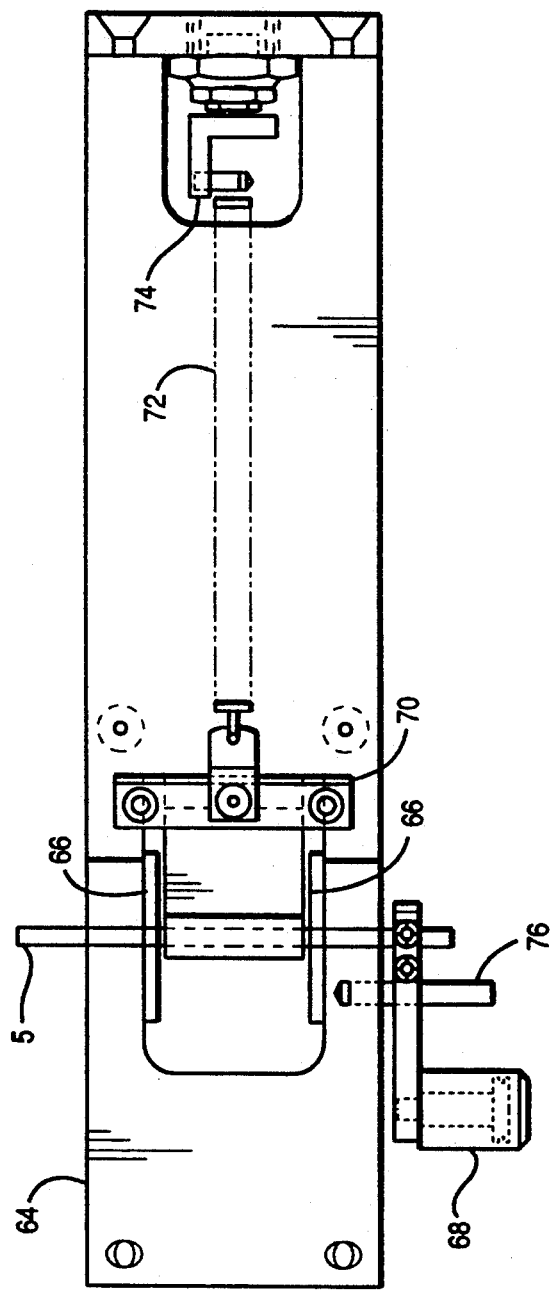
FIG. 8 is a plan view of a winding apparatus used to fabricate the tape wound coil of the present invention.
Figure 9:
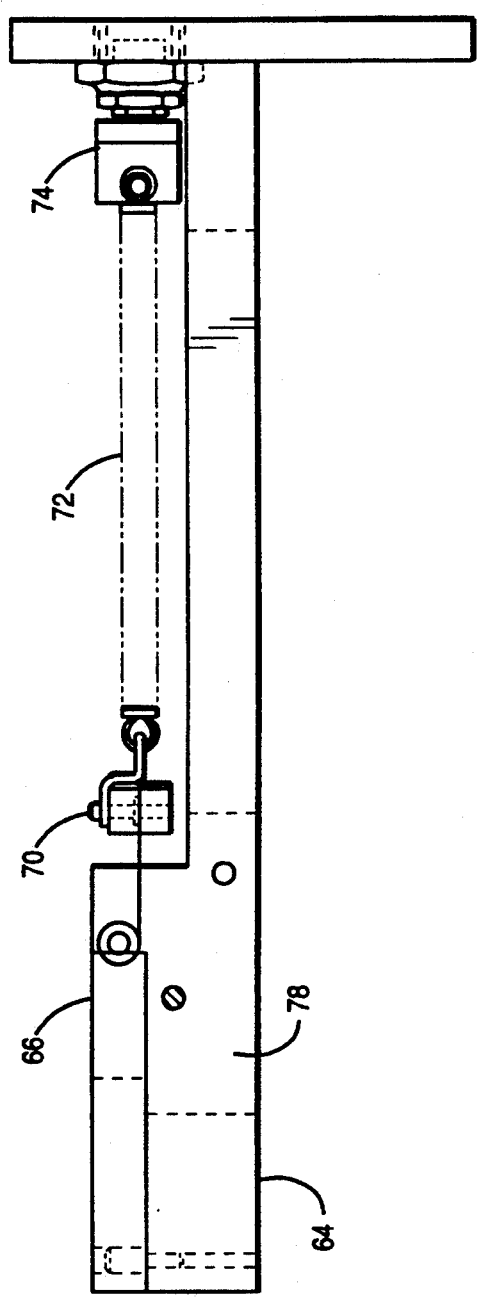
FIG. 9 is an elevation of the winding apparatus of FIG. 8.

Next, foil strip 60 is ready to be wound into a coil. An adhesive must be used to bond the winding layers 3a to one another. In the preferred embodiment an epoxy was chosen as an adhesive due to its high strength, temperature resistance and low viscosity. A plan view of a winding fixture 64 used to fabricate the present invention is shown in FIG. 8. Center post 5 is first placed in an axial support member 66 which rotatingly receives center post 5. The end of foil 60, opposite center post 5 is then attached to a tension spring 72, through a clamp mechanism 70. The clamp and spring assembly is used to hold tension on the completed coil during the time period when it is curing. Spring 72 is attached at the other end to a nonmovable base 74. Initially, clamp 70 with the end of foil 60 therein will be biased toward base 74. A crank handle 68, or the like is then affixed to center post 5 rotated such that foil 60 is wound about post 5. The adhesive is applied onto the metal foil as the coil is being wound. Of course, application of this adhesive any can occur by number of conventional means such as brushing, spraying, or the like. A pan 78 is provided within winding fixture 64 such that excess adhesive is retained therein. It can be seen that once metal foil 60 is completely wound about center post 5, clamp 70 will have be drawn toward support 66 with spring 72 exerting tension onto the coil layers. A stop device 76 is then utilized to prevent crank handle 68 from turning in response to the tension within spring 72. In this manner, spring 72 produces a tension in the newly wound coil such that voids in the bonded winding layers are eliminated and a coil having superior mechanical integrity is produced. FIG. 9 is an elevational view of the winding fixture as shown in FIG. 8 and includes the same features as previously described.

After the coil has been cured, the end of foil 60, not attached to post 5, is unwound to give the desired turn density (which is directly related to coil diameter). Next, the post 5 with foil 60 wound thereabout is cut in the center (along line 80 of FIG. 10), thereby yielding two post and foil assemblies. Wound metal foil 60 is now referred to as winding 3, as previously discussed. Additionally, the portion of post 5 extending out of the coil is removed from the winding 3 by cutting, or the like at points as shown by lines 82 and 84 in FIG. 10.

At this point coil blank 86 is formed which includes winding 3 disposed about center post 5 with the length of post 5 being equal to the thickness of winding 3.

Figure 10:
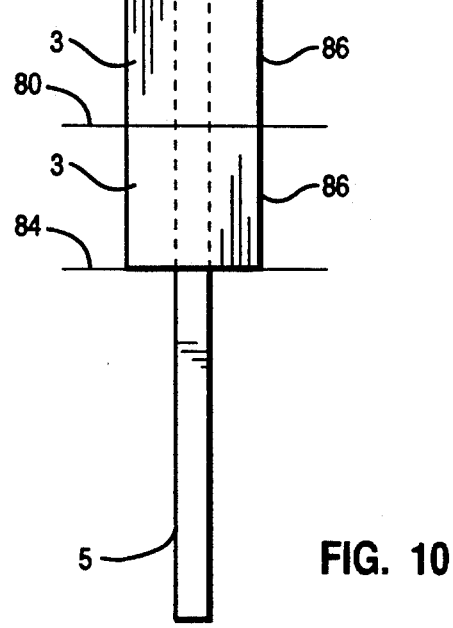
FIG. 10 shows the metal foil wound around a center post during fabrication of the coil of the present invention.

Next, blanks 86 are vacuum and pressure impregnated with a low viscosity dielectric material, e.g., epoxy to ensure that no voids, which may have occurred due to the cutting operations, are present along lines 82 and 84 of FIG. 10. Subsequent to the vacuum and pressure impregnation, the epoxy is then allowed to cure.

Referring to FIG. 1, blank 86 is then counter bored such that cavity 12 is formed and annular area 13 is created when terminal 9 is coaxially disposed within coil 1. The remaining portion of the original post 5 is then tapped to form threads 7 which are used to engage threaded portion 11 of center terminal 9.

Referring to FIGS. 3 and 4, radial cooling slits 19 are then machined into the counter bored and tapped coil 1 by using techniques such as sawing and electrical discharge machining. Cooling slits 19 have been machined using slitting saws with adequate results, however this technique is very difficult due to the large depth to width ratio of slits 19. In a preferred embodiment, the method of the present invention uses electrical discharge machining to form cooling slits 19. This technique is capable of forming slits having a narrow width.

Finally, outer terminal 17 is affixed by soldering, or the like to the outer wrap 15 of the coil 1. This point, coil unit 1 is now completed and can be sealed into a coolant housing of the nagnetic repulsion punch apparatus 27, prior to punching operations.

Although certain preferred embodiments have been shown and described, it should be understood that many changes and modifications may be made therein without departing from the scope of the appended claims.

What is claimed is:

1. A coil used in a magnetic repulsion punching apparatus to drive a punch assembly and form holes in a substrate, comprising:
   an electrically actuated tape wound coil for providing energy to drive said punch assembly which includes a punch head having a circumference substantially identical to a circumference of said coil and rigidly connected to a punch shaft;
   means for cooling said coil by circulating coolant radially through a first side of said coil; and
   means for biasing said punch head adjacent a planar surface of said coil, opposite said first side;

means for providing electrical energy to said coil wherein said punch head is driven in a direction away from said coil and toward said substrate such that said punch shaft forms said holes in said substrate.

2. An apparatus according to claim 1 wherein said means for cooling comprises radial slits formed in said first side of said tape wound coil.

3. An apparatus according to claim 2 wherein said tape wound coil comprises:

concentrically wound electrically conductive foil; and insulating material intermediate said concentrically wound electrically conductive foil for providing electrical insulation from adjacently wound layers of said foil.

4. An apparatus according to claim 3 wherein a side of said tape wound coil opposite said first side is substantially planar and provides an interface surface with said punch assembly.

5. An apparatus according to claim 4 wherein said conductive foil is wound about and affixed to an electrically conductive center post.

6. An apparatus according to claim 5 wherein said center post is in electrical communication with an inner electrical terminal post and a first end of said conductive foil.

7. An apparatus according to claim 6 wherein an end of said conductive foil opposite said first end is in electrical communication with an outer electrical terminal post.

8. An apparatus according to claim 7 wherein said inner and outer electrical terminal posts are electrically connected to said means for providing electrical energy.

* * * * *